United States Patent [19]

Hioki et al.

[11] Patent Number: 4,917,953
[45] Date of Patent: Apr. 17, 1990

[54] METHOD OF FORMING SOLID LUBRICAITNG FILM ON CERAMIC MATERIAL AND PRODUCT PRODUCED BY THE SAME

[75] Inventors: Tatsumi Hioki, Nagoya; Shogo Hibi; Jun-ichi Kawamoto, both of Aichi, Japan

[73] Assignee: Kabushiki Kaisha Toyota Chuo Kenkyusho, Aichi, Japan

[21] Appl. No.: 161,104

[22] Filed: Feb. 26, 1988

[30] Foreign Application Priority Data

Feb. 28, 1987 [JP] Japan .................................. 62-45987

[51] Int. Cl.$^4$ ............................ B32B 9/00; B05D 3/06
[52] U.S. Cl. .................................... 428/408; 427/38; 427/39; 427/41; 427/42; 427/228; 428/409; 428/688
[58] Field of Search ........................ 427/38, 39, 41, 42, 427/228; 428/408, 409, 688

[56] References Cited

U.S. PATENT DOCUMENTS

| | | | |
|---|---|---|---|
| 3,318,790 | 5/1967 | Carbajal, III et al. ................. | 427/41 |
| 3,406,040 | 10/1968 | Da Silva et al. ...................... | 427/42 |
| 3,776,762 | 12/1973 | Bernath ................................. | 427/41 |
| 4,657,774 | 4/1987 | Satou et al. ........................... | 427/38 |
| 4,693,799 | 9/1987 | Yanagihara et al. .................. | 427/41 |
| 4,756,977 | 7/1988 | Haluska et al. ...................... | 427/228 |

FOREIGN PATENT DOCUMENTS

| | | | |
|---|---|---|---|
| 57-108259 | 7/1982 | Japan ................................... | 427/228 |
| 61-238961 | 10/1986 | Japan ................................... | 427/228 |

*Primary Examiner*—Stanley Silverman
*Attorney, Agent, or Firm*—Oblon, Spivak, McClelland, Maier & Neustadt

[57] ABSTRACT

A ceramic member composed of a ceramic material which is coated with a solid lubricating film. The solid lubricating film is formed on the surface of the ceramic material by heating and evaporating in a vacuum atmosphere having a vacuum degree of not less than $10^{-4}$ Torr an organic material which has a vapor pressure of not more than $10^{-4}$ Torr at room temperature while implanting the ions of a gas element having an energy of not less than 1 keV on the surface of the organic material at the rate of not less than $1 \times 10^{15}$ ions/cm$^2$. A method of forming such a solid lubricating film on the surface of a ceramic material is also disclosed.

14 Claims, 3 Drawing Sheets

METHOD OF FORMING SOLID LUBRICAITNG FILM ON CERAMIC MATERIAL AND PRODUCT PRODUCED BY THE SAME

BACKGROUND OF THE INVENTION

1. Field of the Invention

The present invention relates to a method of forming a solid lubricating film on the surface of a substrate of a ceramic material and a ceramic member having a solid lubricating film. More particularly, the present invention relates to a ceramic member such as a ceramic bearing which is used for various precision appliances such as a semiconductor manufacturing apparatus, an electronic appliance and a space appliance, and a method of forming the solid lubricating film of such a ceramic member.

2. Description of the Prior Art

In order to provide lubricating properties for a sliding member of a ceramic material, the surface of the ceramic material is conventionally coated with a film of a solid lubricant. In this case, a material having a lamellar structure such as molybdenum disulfide, tungsten diselenide, graphite and lead oxide is used as the solid lubricant. When such a solid lubricant is formed into a film for covering the surface of the sliding member, a method of mixing the particles of the solid lubricant with an organic or inorganic binder, applying the mixture onto the surface of the sliding member, and baking the sliding member, for example, is adopted.

It is desirable that the solid lubricating film of a sliding member used for a precision appliance is as thin as possible and, at the same time, has a long life. This is because in a precision appliance, even a sliding member is requested to maintain a high dimensional accuracy. One of the most important element for forming a solid lubricating film on a ceramic material is the adhesion between the film and the material, because the higher the adhesion is, the longer becomes the life of the film. Therefore, if the life of the film to be obtained is the same, the higher the adhesion is, the smaller is the thickness which the film is required to have.

It is known that it is possible to form a carbon film on a desired substrate by coating the substrate with an organic resin and irradiating the substrate with ions. For example, Bernard A. Matthiver et al. adopt this method for the surface of a metal and provide a method of improving the resistance to damage of the metal, as disclosed in Japanese Pat. Laid-Open No. 159168/1985.

Bernard A. Matthiver et al. also provide a method of multiple irradiation for enhancing the adhesion between a carbon film and the metal of a substrate, in which after ions are irradiated with a first energy, ions are irradiated again with a second energy which is smaller than the first energy. What is important in this method is that the carbon film obtained by this method is useful only for the materials having the surface characteristics which are metallurgically, namely, chemically fitted for the carbon film, as pointed out by Bernard A. Matthiver. In other words, the material of the substrate is restricted to a metal which can produce a compound with carbon, e.g., an Fe-base alloy.

This method requires a large number of steps for coating and a fine adjustment is required in each step in order to obtain a good film. In addition, in order to make a film having a long life, in other words, a film resistible to a number of times of sliding operations, the film is ordinarily required to have a thickness of not less than 10 $\mu$m.

If ions are irradiated on the ceramic surface after it has been coated with an organic resin, the adhesion is insufficient even if a multi-irradiation method is adopted. One reason for this is considered to be that the carbon film and the ceramic material do not fit together metallurgically. As a result of studies, the present inventors have found that another reason for the conventional insufficient adhesion is that when the organic resin film which has been formed in advance, for example, by applying the organic resin on the ceramic substrate is carbonized by ion irradiation, the resin film largely changes in the density, in other words, contracts, thereby producing a large strain stress on the interface between the carbon film and the substrate. It is therefore expected that if the generation of the residual stress on the interface is suppressed as much as possible, it will be possible to form a carbon film having a high adhesion by ion irradiation even on a ceramic surface.

As a result of the studies undertaken by the present inventors on the basis of this view, it has been found that if the deposition of an organic material and ion irradiation are simultaneously carried out, it is possible to form a carbon film having a good adhesion even on a ceramic surface.

SUMMARY OF THE INVENTION

Accordingly, it is an object of the present invention to eliminate the above-described problems in the prior art and to provide a ceramic member composed of a ceramic material coated with a film having good solid lubricating properties, and a method of forming the film from an organic material with ease and simultaneously adhering the film on the ceramic surface with good adhesion by ion irradiation. To achieve this aim, the present invention provides a method of forming a solid lubricating film on the surface of a ceramic material and a product produced by the same characterized in that an organic material having a vapor pressure of not more than $10^{-4}$ Torr at room temperature is heated in a vacuum atmosphere having a vacuum degree of not less than $10^{-4}$ Torr so as to be deposited on the surface of the ceramic substrate which is placed in the vacuum atmosphere, and simultaneously the ions of a gas element having an energy of not less than 1 keV are implanted on the surface of the ceramic material at the dose of not less than $1 \times 10^{15}$ ions/cm$^2$.

In a preferred embodiment of the present invention, for example, (1) the element material is nitrogen, helium, neon, argon, krypton or xenon, and (2) the ceramic member is a sliding member made of a ceramic material.

The present invention has been achieved as a result of the studies undertaken by the present inventors on the basis of the facts that ion irradiation at a high energy is generally useful for enhancing the adhesion between a film and a substrate, that a carbon film has a function of preventing a chemical reaction between sliding members, and that ion irradiation to an organic material generally causes carbonization, thereby changing the organic material into an inorganic material containing carbon at a high density.

The above and other objects, features and advantages of the present invention will become clear from the following description of the preferred embodiments thereof, taken in conjunction with the accompanying drawings.

DESCRIPTION OF THE PREFERRED EMBODIMENTS

Figure 1:
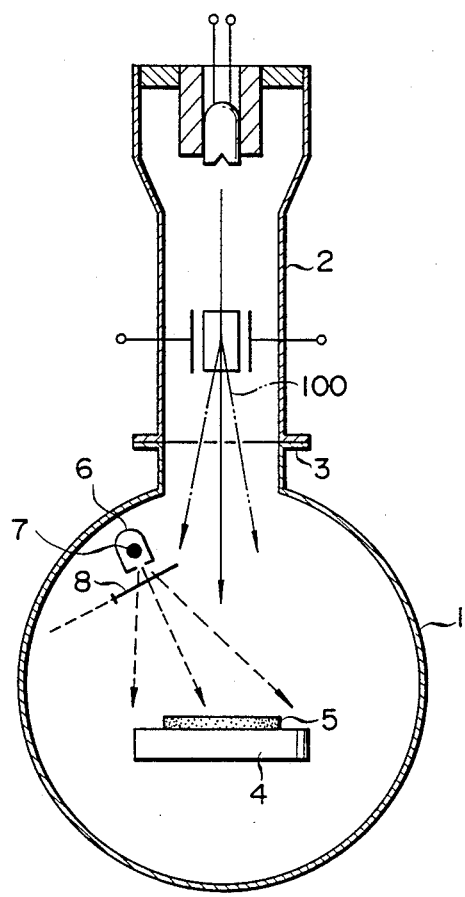
FIG. 1 schematically shows the structure of an apparatus used in the method of forming a solid lubricating film on the surface of a ceramic substrate according to the present invention.

A method according to the present invention will be described in more detail hereinunder. Referring to FIG. 1, a vacuum container 1 used for coating treatment is connected to a known ion beam generator 2 which generates ion beams 100 of a high energy at a connector portion 3 so that the ion beams 100 are introduced into the vacuum container 1. A ceramic substrate 5 being treated is placed on a substrate holder 4. A heater 6 is provided in the vacuum container 1 at a position from which the surface of the ceramic substrate 5 is visible. When an organic material 7 is inserted in the heater 6 as an evaporation source, the heater 6 is heated to evaporate the organic material 7. The vapor evaporated from the heater 6 is isolated by a shutter 8. When the heater 6 is heated to an appropriate temperature, the shutter 8 is opened and simultaneously irradiation of the ion beams 100 is started. The thickness of a carbon film formed on the surface of the ceramic substrate 5 is controlled by the period during which the shutter 8 is opened. The energy and the species of the ion beams implanted and the amount of irradiation are freely selected by the ion beam generator 2. In order to obtain a film having a high carbon density, the total amount of irradiation is increased. The total amount of implantation within a predetermined period is controlled by controlling the electric current density of the ion beams.

The organic material used as the evaporation source in the present invention is placed in the vacuum container, because the evaporation of the material and ion irradiation must be carried out simultaneously. A high vacuum of not less than $10^{-4}$ is necessary for ion irradiation. It is therefore necessary to use an organic material having a vapor pressure of not more than $10^{-4}$ at room temperature as the evaporation source. Such organic materials include various kinds of materials liquid or solid at ordinary temperature. Examples of liquid materials are silicone oils and hydrocarbon oils which are used as sealing oils for a vacuum pump, and fluorine oils used as lubricating oils. Among these, methylphenylsiloxane (silicon oil), alkylnaphthalene (hydrocarbon oil) and perfluoro polyether (fluorine oil) are typical. As the solid material, for example, naphthalene, anthracene and phthalocyanine are usable. These may be used either singly or in the form of a mixture.

For the ion beams to be irradiated, any species may be usable which is capable of causing decomposition and carbonization of the organic material and has a mass as large as or more than He. From the point of view of easiness to produce ion beams, gas elements, in particular, He, N, Ne, Ar, Kr and Xe are preferable. These elements are also favorable in that the ions thereof do not react with the carbon film formed in such a manner as to change the quality of the film.

The ions are required to have so much an energy as to cause adequate decomposition and carbonization of the organic material. The energy is ordinarily not less than 1 keV.

The amount of ion irradiation necessary for producing a carbon film having good solid lubricating properties is different by the species of the ions used. In the case of $He^+$ ions, the amount of ion irradiation is preferably not less than $1 \times 10^{16}$ ions/cm$^2$ and in the other cases, it is preferably not less than $1 \times 10^{15}$ ions/cm$^2$. If the amount of irradiation is less than the above described value, it is impossible to obtain a good adhesiveness of the carbon film. Furthermore, a film containing a large amount of element other than carbon, namely, element constituting the organic material such as hydrogen is obtained, and such a film is unfavorably chemically unstable.

The operation of the present invention will now be explained, taking, as an example, the case of coating the surface of a silicon nitride ($Si_3N_4$) ceramic substrate with a carbon film by using liquid pentaphenyl·trimethyltrisiloxane represented by the following structural formula:

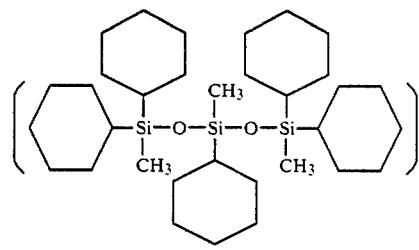

as an organ c material for the evaporation source and implanting $Ar^+$ ions.

Pentaphenyl trimethylsiloxane is charged into a heater for an evaporation source in a vacuum container, and after the vacuum container is evacuated to about $10^{-6}$ Torr the heater is heated. When the temperature of the heater rises to about 80° C., the shutter is opened, whereby pentaphenyl trimethyltrisiloxane adheres to the surface of the $Si_3N_4$ substrate. Pentaphenyl trimethylsiloxane is considered to fly in the form of molecules or clusters and adheres to the surface of the ceramic substrate. Simultaneously with the opening of the shutter, $Ar^+$ ions accelerated to 100 keV, for example, are irradiated on the ceramic substrate, whereby $Ar^+$ ions collide with the pentaphenyl trimethyltrisiloxane molecules and decompose the molecules. The part of a molecule in which the chemical combination is weak is decomposed most. In pentaphenyl trimethyltrisiloxane, the C-H combination is cut and the hydrogen atom is released from the molecule. Most of these hydrogen atoms combine with each other and are released in the form of hydrogen molecules. Consequently, the material which contain carbon, silicon and oxygen remains on the surface of the ceramic substrate. The subsequent ion irradiation releases not only hydrogen but also oxygen from the thus-obtained initial film, thereby the film is changed into the material consisting of carbon and silicon. In this way, ion irradiation changes the organic material into an inorganic material which contains carbon at a high density, and this process accompanies a large contraction (change in volume or density). When such a change occurs on the surface of a substrate, if the change occurs in the stage wherein the material which changes has a very thin layer such as one molecular layer or several molecular layers, the contraction is free from any restriction. Therefore, almost no residual stress is generated on the interface between the thus-produced inorganic thin film and the substrate. That the evaporation of the organic material and the ion irradiation are simultaneously carried out means that very thin layers of a carbon film are continuously deposited. The carbon film formed by the method according to the present invention therefore produces almost no residual stress even if the film is formed to a thickness of several $\mu$m. As a result, it is possible to prevent the reduction in adhesion caused by a residual stress. The high adhesion of the carbon film formed on the surface of a ceramic surface by the method of the present invention is mainly ascribed to the fact that little stress remains in the film, as described above.

A solid lubricating film is required to have not only a long life but also good lubricating properties. A ceramic member coated with a carbon film according to the present invention exhibits a low friction coefficient when sliding on another ceramic, metal or plastic member, as will be shown in the embodiments which will be described later. Materials consisting of carbon, such as graphite and diamond are chemically considerably stable. Accordingly, if such a material exists between two relatively sliding materials, it prevents the chemical bonding of the two materials, so that the two materials relatively slide with low friction and low abrasion. As is clear from the above explanation, the carbon film formed by the method of the present invention contains carbon at a high density. In addition, the film contains many six-membered rings, which are considered to form crystallites of graphite. It was actually proved from the observation by a transmission electron microscope that crystallites of graphite are contained. In other words, it can be said that the carbon film formed by the method of the present invention mainly consists of amorphous carbon containing graphite crystallites. In the case of using pentaphenyl trimethyltrisiloxane as the evaporation source material, a slight amount of Si, O and, probably, H is contained in the film produced. The amount of these elements contained, however, is so small that they will have little influence on the lubricating properties of the solid lubricating film produced.

The present invention will be explained in more detail with the following non-limitative examples. In the examples, the apparatus shown in FIG. 1 was used.

EXAMPLE 1

On the surface of a sintered $Si_3N_4$ disc having a surface roughness of not more than 0.1 $\mu$m, and 5 mm in thickness and 30 mm in diameter, pentaphenyl trimethyltrisiloxane heated to 70° C. was deposited and simultaneously $Ar^+$ ions having an energy of 100 keV were irradiated. The electric current density of the ion beams was not more than 1 $\mu$A/cm$^2$. The deposition and the ion irradiation were carried out for about 30 minutes. The total amount of ion irradiation was 1 $\times 10^{16}$ ions/cm$^2$. The thickness of the thus-obtained carbon film was measured by a backscattering spectroscopy and a surface roughness meter. Both of the measured values were 0.12 $\pm$0.02 $\mu$m.

Figure 2:
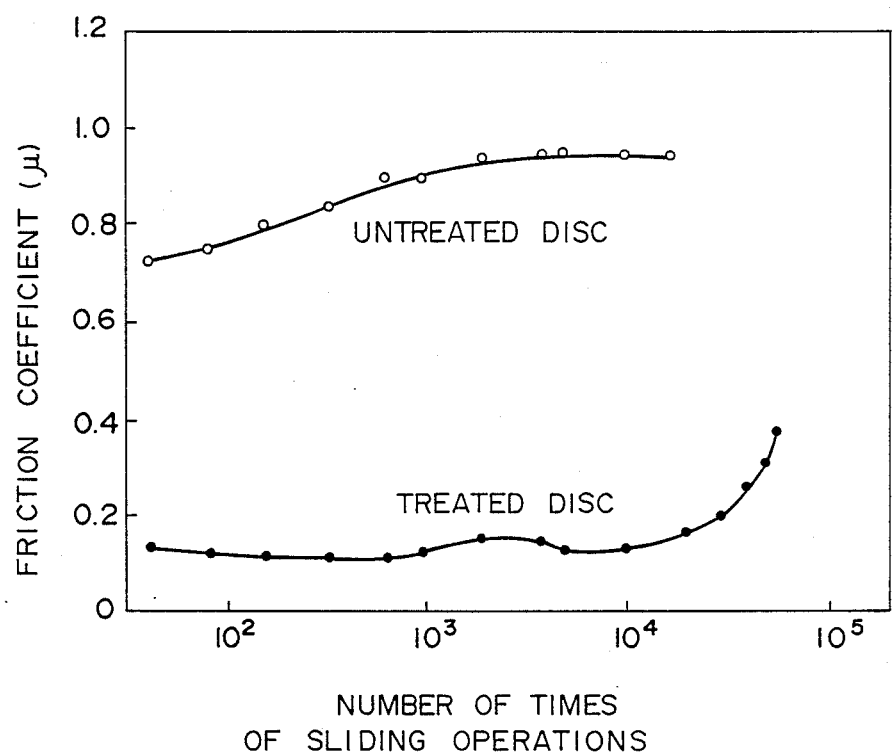
FIG. 2 is a graph showing the relationship between the number of times of sliding operations and the friction coefficient of the sintered $Si_3N_4$ disc treated by the method of the present invention and an untreated disc.
Figure 3:
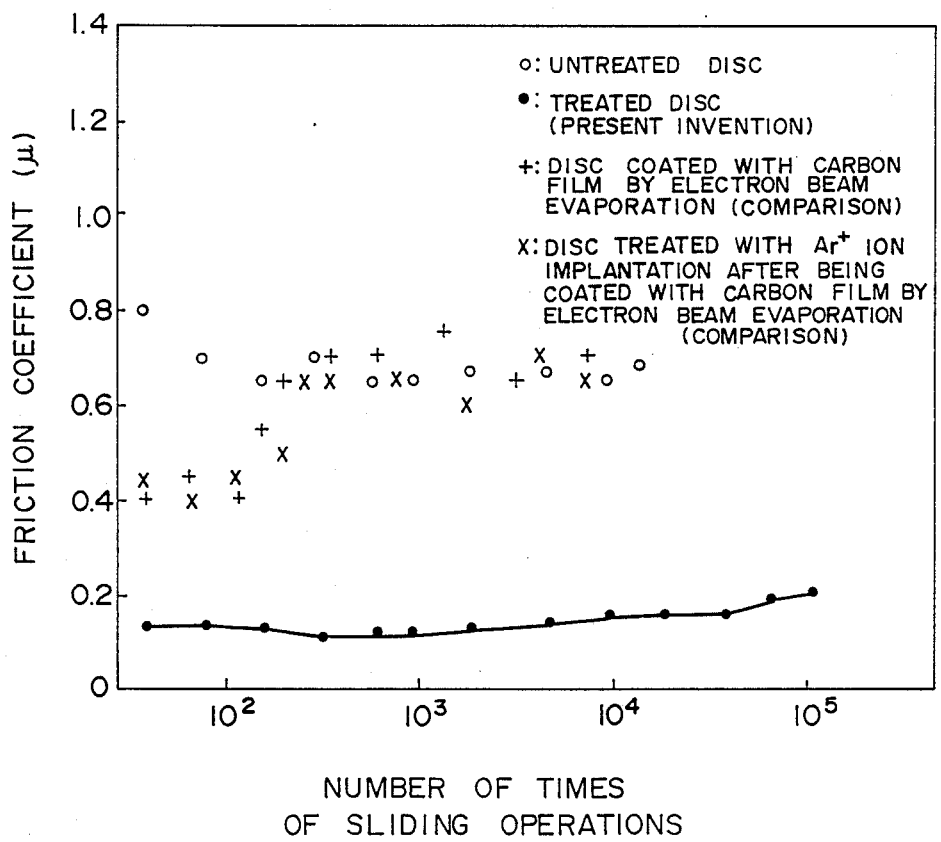
FIG. 3 is a graph showing the relationship between the number of times of sliding operations and the friction coefficient of the disc treated by the method of the present invention, an untreated disc and a disc treated by another method.

The wear and abrasion characteristics of the thus-treated disc relative to a spherical sintered $Si_3N_4$ pin having a diameter of 5 mm were evaluated by using a pin-on-disc type abrasion tester. FIG. 2 shows the relationship between the friction coefficient $\mu$ and the number of times of sliding operations of the treated disc as compared with that of an untreated disc. The tests were carried out without any lubrication at room temperature in the air. The load of the pin was 0.2 kg and the discs were rotated at the rate of 80 rpm. The material of the pin was changed to SUJ 2 (steel) and the same tests were carried out. The results are shown in FIG. 3. For comparison, the same $Si_3N_4$ disc as the treated disc in FIG. 3 was coated with a carbon film of 0.15 $\mu$m thick by the electron beam evaporation of molten graphite, and another $Si_3N_4$ disc was irradiated with $Ar^+$ ions having an energy of 100 keV at the rate of 1 $\times 10^{16}$ ions/cm$^2$ after the disc was coated with a 0.15 $\mu$m-thick carbon film by electron beam evaporation. The results of the tests on these discs are also shown in FIG. 3. It is clear from FIGS. 2 and 3 that $Si_3N_4$ ceramic substrate coated with a carbon film in accordance with the present invention has excellent lubricating properties whether the material of the member along which the substrate slides is a ceramic material or a metal material. It is also clear from FIG. 3 that the sliding member produced by the method of the present invention has much more excellent solid lubricating properties than the sliding member produced by directly depositing carbon on the surface of a ceramic substrate or implanting ions on a carbon-deposited ceramic substrate.

EXAMPLE 2

On the surfaces of sintered discs of SiC, $Al_2O_3$ and $ZrO_2$ containing 3 mol % of $Y_2O_3$, respectively, pentaphenyl trimethyltrisiloxane heated to 80° C. was deposited and simultaneously $Ar^+$ ions having an energy of 1.5 MeV were irradiated, thereby coating the surface of each disc with a carbon film of about 1 $\mu$m thick. The deposition and the ion irradiation were carried out for about 1 hour. The electric current density of ion beams was 2 $\mu$A/cm$_2$, and the total amount of ion irradiation was $5\times 10^{-6}$ ions/cm$^2$. The frictions between the thus-treated discs and SiC, $Al_2O_3$, $ZrO_2$, SUJ 2 and high-density polyethylene pins were tested by a pin-on-disc type abrasion tester. The test conditions were the same as in Example 1. With respect to each disc, the friction coefficient $\mu$ of the disc, the relative abrasion wear of each of the pins, and the life of the film (the number of times of sliding operations repeated until $\mu > 0.3$) are shown in Table 1 as compared with the results of the tests on an untreated disc. It is obvious from Table 1 that if a disc is coated with a carbon film in accordance with the present invention, the friction coefficient is reduced to 0.1 to 0.15, and the relative abrasion wear of the pin is reduced by one order of magnitude whether the material of the member along which the substrate slides is a ceramic, metal or plastic material. It is also clear that the film of 1 $\mu$m thick can stand at least $10^5$ sliding operations.

TABLE 1

| Material of disc | Material of pin | Friction coefficient $\mu$ | Relative abrasion wear of pin (mm²/kg) | Number of times of sliding operations repeated until $\mu > 0.3$ |
|---|---|---|---|---|
| SiC (untreated) | SUJ 2 | 0.65 | $2.5 \times 10^{-8}$ | — |
|  | SiC | 0.50 | $2.8 \times 10^{-8}$ | — |
| SiC (treated) | SUJ 2 | 0.10 | $3.8 \times 10^{-10}$ | $>3 \times 10^5$ |
|  | SiC | 0.12 | $1.1 \times 10^{-9}$ | $1 \times 10^5$ |
| Al₂O₃ (untreated) | SUJ 2 | 0.50 | $1.0 \times 10^{-8}$ | — |
|  | Al₂O₃ | 0.60 |  | — |
|  | High-density polyethylene | 0.35 |  | — |
| Al₂O₃ (treated) | SUJ 2 | 0.10 | $1.5 \times 10^{-10}$ | $>2 \times 10^5$ |
|  | Al₂O₃ | 0.12 |  | $1 \times 10^5$ |
|  | High-density polyethylene | 0.15 |  | $>1 \times 10^5$ |
| ZrO₂ (untreated) | SUJ 2 | 0.50 | $3.5 \times 10^{-8}$ | — |
|  | ZrO₂ | 0.40 |  | — |
| ZrO₂ (treated) | SUJ 2 | 0.10 | $2.7 \times 10^{-9}$ | $>2 \times 10^5$ |
|  | ZrO₂ | 0.10 |  | $>2 \times 10^5$ |

EXAMPLE 3

On the surface of a sintered Si₃N₄ disc, pentaphenyl trimethyltrisiloxane heated to 70° C. was deposited and simultaneously ions were irradiated, thereby coating the surface of the disc with a carbon film. As the ions irradiated, He⁺, N⁺, Ne⁺ and Ar⁺ were used while varying the implanting conditions. These implanting conditions and the solid lubricating characteristics of the thus-obtained films are shown in Table 2. The friction coefficient and the life of the film were evaluated in the same way as in Example 1 by causing the disc to slide along an SUJ 2 pin.

TABLE 2

| | Ion implantating conditions | | | Solid lubricating properties | | |
|---|---|---|---|---|---|---|
| Species | Accelerated energy (keV) | Electric current density ($\mu$A/cm²) | Total amount of irradiation (ions/cm²) | Film thickness ($\mu$m) | $\mu$ | Number of times of sliding operations repeated until $\mu \geq 0.3$ |
| He⁺ | 30 | 10 | $1 \times 10^{17}$ | 0.21 | 0.12 | $\sim 1 \times 10^5$ |
|  | 30 | 10 | $2 \times 10^{17}$ | 0.35 | 0.12 | $>2 \times 10^5$ |
| N⁺ | 50 | 5 | $1 \times 10^{17}$ | 0.28 | 0.12 | $>2 \times 10^5$ |
| Ne⁺ | 100 | 1 | $1 \times 10^{16}$ | 0.25 | 0.12 | $>2 \times 10^5$ |
| Ar⁺ | 150 | 1 | $1 \times 10^{16}$ | 0.23 | 0.12 | $\sim 2 \times 10^5$ |

EXAMPLE 4

Sintered Si₃N₄ discs were coated with carbon films by implanting Ar⁺ ions having an energy of 100 keV and using anthracene, naphthalene, eicosyl naphthalene, alkylnaphthalene and methylsilicone, respectively, as the evaporation source material. The treating conditions are shown in Table 3. The friction characteristics of each of the thus-treated discs exhibited when sliding along an SUJ 2 pin were evaluated in the same way as in Example 1. The results are also shown in Table 3.

TABLE 3

| Evaporation source | | Ion irradiation | | Solid lubricating properties | | |
|---|---|---|---|---|---|---|
| Organic material | Heating temperature (°C.) | Electric current density ($\mu$A/cm²) | Total amount of implantation (ions/cm²) | Film thickness ($\mu$m) | $\mu$ | Number of times of sliding operations repeated until $\mu > 0.3$ |
| Anthracene | 60 | 5 | $5 \times 10^{16}$ | 1.5 | 0.18 | $>2 \times 10^5$ |
| Naphthalene | 50 | 5 | $5 \times 10^{16}$ | 1.0 | 0.15 | $>2 \times 10^5$ |
| Eicosyl naphthalene | 80 | 2 | $5 \times 10^{16}$ | 0.2 | 0.12 | $\sim 1 \times 10^5$ |
| Alkyl-naphthalene | 65 | 2 | $5 \times 10^{16}$ | 0.3 | 0.12 | $\sim 2 \times 10^5$ |
| Methyl polysiloxane | 75 | 2 | $5 \times 10^{16}$ | 0.2 | 0.15 | $\sim 1 \times 10^5$ |
| Perfluoro polyether | 50 | 2 | $5 \times 10^{16}$ | 0.2 | 0.15 | $\sim 5 \times 10^4$ |

As described above, the method of forming a solid lubricating film on the surface of a ceramic substrate, in which an organic material is deposited on the surface of the ceramic substrate under a high vacuum and simultaneously ions are irradiated thereon, enables a solid film having excellent lubricating properties to be formed on the surface of the ceramic substrate.

The method of the present invention also enables fine control of the thickness of a carbon film which is to be formed on the surface of a ceramic material. More specifically, since the carbon film is formed by depositing an organic material in the form of molecules or clusters on the surface of the ceramic substrate and simultaneously implanting ions thereon, the film thickness is controlled by varying the amount of deposition of the organic material. Thus, the method of the present invention is preferable as a method of forming a solid lubricating film of a ceramic sliding member which is used for a precision apparatus.

A ceramic sliding member coated with a carbon film by the method of the present invention exhibits good lubricating properties, in other words, has a low friction coefficient and an effect of reducing the abrasion of a member on which the sliding member slides, whether te latter member is made of a ceramic, metal or plastic material. In addition, such effect holds for a long time. According to the method of the present invention, it is possible to obtain a solid lubricating film which is effective against $10^5$ sliding operations or more without any lubrication by coating a substrate with a film of not more than 1 μm thick. Accordingly, the method of the present invention is applicable to a ceramic sliding member for reducing the friction and abrasion of the sliding part, preventing the seizure of the sliding part, and providing a sliding surface in the state of having been subjected to running-in. Ceramic sliding members coated with a carbon film in accordance with the present invention are very excellent as sliding members such as ceramic bearings for appliances which are used in a clean atmosphere or vacuum atmosphere, e.g., a semiconductor manufacturing apparatus, cathode tubes and space appliance. The method of the present invention is also applicable to the sliding surfaces or bearings of a diesel engine or a turbocharger, and the sliding surface of a ceramic artificial joint.

As described above, the method according to the present invention is applicable to a wide range of fields of industry, medicine, etc., and is capable of providing a useful sliding member having excellent characteristics in any of these fields.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A method of forming an inorganic solid lubricating film on the surface of a ceramic material comprising the steps of:
   (1) evaporating a liquid or solid organic material by heating the same in a vacuum atmosphere having a vacuum degree of not less than $10^{-4}$ Torr, said organic material having a vapor pressure of not more than $10^{-4}$ Torr at room temperature thereby decomposing the same into molecules or clusters;
   (2) emitting and depositing said organic material, in the form of molecules or clusters, onto the surface of said ceramic material disposed in said vacuum atmosphere, and
   (2) irradiating the ions of a gas element at a dosage of not less than $1 \times 10^{15}$ ions/cm$^2$ on the surface of said ceramic material simultaneously with said emitting and depositing step, said gas element having an energy of not less than 1 kev, so as to carabonize said organic material into an inorganic material containing carbon at a high density.

2. A method of forming an inorganic solid lubricating film on the surface of a ceramic material according to claim 1, wherein said gas element is one selected from the group consisting of helium, neon, argon, krypton and xenon.

3. A method of forming an inorganic solid lubricating film on the surface of a ceramic material according to claim 1, wherein said ceramic material is a ceramic sliding member.

4. A method according to claim 2, wherein said organic material is at least one selected from the group consisting of methylphenylsiloxane, alkylnaphthalene, perfluoro polyether and methylpolysiloxane.

5. A method according to claim 1, wherein said organic material is at least one selected from the group consisting of naphthalene, anthracene and phthalocyanine.

6. A ceramic member comprising:
   a ceramic material;
   an inorganic solid lubricating film formed on the surface of said ceramic material, which is produced by the steps of:
   (1) evaporating a liquid or solid organic material by heating the same in a vacuum atmosphere having a vacuum degree of not less than $10^{-4}$ Torr, said organic material having a vapor pressure of not more than $10^{-4}$ Torr at room temperature thereby decomposing he same into molecules or clutters;
   (2) emitting and depositing said heated and evaporated organic material in the form of molecules or cluters onto the surface of said ceramic material in said vacuum atmosphere,
   (3) irradiating the ions of a gas element at a dosage of not less than $1 \times 10^{15}$ ions/cm$^2$ on the surface of said ceramic material simultaneously with said emitting and depositing step, said gas element having an energy of not less than 1 kev so as to carbonize said organic material into an inorganic material containing carbon at a high density.

7. A ceramic member according to claim 6, wherein said organic material is pentaphenyl trimethyltrisiloxane.

8. A ceramic member according to claim 6, wherein said ceramic material is silicon nitride.

9. A ceramic member according to claim 6, wherein said gas element is selected from the group consisting of helium, neon, argon, krypton and xenon.

10. A method of forming an inorganic solid lubricating film on the surface of a ceramic material according to claim 1, wherein said organic material is pentaphenyl trimethyltrisiloxane.

11. A method of forming an inorganic solid lubricating film on the surfaces of a ceramic material according to claim 1, wherein said ceramic material is silicon nitride.

12. A ceramic member having an inorganic solid lubricating film formed thereon according to claim 6, wherein said ceramic material is a ceramic sliding member.

13. A ceramic member having an inorganic solid lubricating film formed thereon according to claim 6, wherein said organic material is at least one selected from the group consisting of methylphenylsiloxane, alkylnaphthalene, perfluropolyether and methylpolysiloxane.

14. A ceramic member having an inorganic solid lubricating film formed thereon according to claim 6, wherein said organic material is at least one selected from the group consisting of naphthalene, anthracene and phthalocyanine.

* * * * *